United States Patent
Cheng et al.

(10) Patent No.: US 9,761,667 B2
(45) Date of Patent: Sep. 12, 2017

(54) SEMICONDUCTOR STRUCTURE WITH A SILICON GERMANIUM ALLOY FIN AND SILICON GERMANIUM ALLOY PAD STRUCTURE

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/813,330

(22) Filed: Jul. 30, 2015

(65) Prior Publication Data
US 2017/0033182 A1   Feb. 2, 2017

(51) Int. Cl.
| | |
|---|---|
| *H01L 29/10* | (2006.01) |
| *H01L 21/02* | (2006.01) |
| *H01L 29/161* | (2006.01) |
| *H01L 29/66* | (2006.01) |
| *H01L 29/78* | (2006.01) |
| *H01L 21/308* | (2006.01) |

(52) U.S. Cl.
CPC ...... *H01L 29/1054* (2013.01); *H01L 21/0245* (2013.01); *H01L 21/0251* (2013.01); *H01L 21/02532* (2013.01); *H01L 21/02612* (2013.01); *H01L 21/308* (2013.01); *H01L 29/161* (2013.01); *H01L 29/66795* (2013.01); *H01L 29/785* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 8,053,299 B2 | 11/2011 | Xu | |
| 8,211,772 B2 | 7/2012 | Kavalieros et al. | |
| 8,629,478 B2 | 1/2014 | Ko et al. | |
| 8,648,400 B2 | 2/2014 | Xu | |
| 2005/0093154 A1* | 5/2005 | Kottantharayil | .... H01L 29/1054 257/745 |

(Continued)

OTHER PUBLICATIONS

Liow, T.-Y., "Investigation of silicon-germanium fins fabricated using germanium condensation on vertical compliant structures", Applied Physics Letters, Dec. 26, 2005, 262104-1 to 262104-3.

*Primary Examiner* — Mary Wilczewski
*Assistant Examiner* — Erik T Peterson
(74) *Attorney, Agent, or Firm* — Scully, Scott, Murphy & Presser, P.C.; Daniel P. Morris, Esq.

(57) ABSTRACT

A semiconductor structure is provided that includes a silicon germanium alloy fin having a second germanium content located on a first portion of a substrate. The structure further includes a laterally graded silicon germanium alloy material portion located on a second portion of the substrate. The laterally graded silicon germanium alloy material portion is spaced apart from the silicon germanium alloy fin and has end portions having the second germanium content and a middle portion located between the end portions that has a first germanium content that is less than the second germanium content.

11 Claims, 4 Drawing Sheets

(56) References Cited

U.S. PATENT DOCUMENTS

| | | | |
|---|---|---|---|
| 2007/0241399 A1* | 10/2007 | Irisawa | H01L 29/66795 257/347 |
| 2008/0237575 A1* | 10/2008 | Jin | B82Y 10/00 257/19 |
| 2009/0085027 A1 | 4/2009 | Jin et al. | |
| 2009/0090934 A1* | 4/2009 | Tezuka | H01L 27/1211 257/190 |
| 2011/0024804 A1* | 2/2011 | Chang | H01L 29/165 257/288 |
| 2011/0147811 A1 | 6/2011 | Kavalieros et al. | |
| 2011/0193178 A1* | 8/2011 | Chang | H01L 29/7853 257/408 |
| 2012/0241818 A1 | 9/2012 | Kavalieros et al. | |
| 2014/0175543 A1* | 6/2014 | Glass | H01L 21/823431 257/337 |
| 2015/0194525 A1* | 7/2015 | Xu | H01L 29/66795 257/192 |

* cited by examiner

SEMICONDUCTOR STRUCTURE WITH A SILICON GERMANIUM ALLOY FIN AND SILICON GERMANIUM ALLOY PAD STRUCTURE

BACKGROUND

The present application relates to semiconductor technology, and more particularly to a method and structure for enabling silicon germanium alloy fins having a height that is greater than the critically thickness of an epitaxial silicon germanium alloy layer that is used to provide the silicon germanium alloy fins.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs. In order to extend these devices for multiple technology nodes such as, for example, 10 nm and beyond, there is a need to boost the performance with high-mobility channels.

In such FinFET devices, a fin containing a silicon germanium alloy is one promising channel material because of its high-carrier mobility, especially in regard to being used as a channel material for a pFinFET device. Silicon germanium alloy fins can be formed by epitaxially growing a silicon germanium alloy layer on a surface of a silicon (Si) substrate and then patterning the silicon germanium alloy layer. This prior art method of forming silicon germanium alloy fins has some drawbacks associated therewith. For example, the direct epitaxial growth of a silicon germanium alloy on a Si substrate has a critical thickness limit. Above the critical thickness, silicon germanium is very defective and is not suitable for use as a device channel material. This prevents a thick silicon germanium alloy layer for high silicon germanium alloy fin heights. Moreover, this approach is not scalable for silicon germanium alloy fins having a high (i.e., greater than 70 atomic %) germanium content.

In view of the above, there is a need for providing a method of forming silicon germanium alloy fins that avoids the drawbacks associated with prior art silicon germanium alloy fin formation.

SUMMARY

In one aspect of the present application, a method of forming a semiconductor structure is provided. In one embodiment, the method includes providing a fin structure comprising, from bottom to top, a silicon material fin portion, a silicon germanium alloy fin portion having a first germanium content and a first width, and a hard mask material fin portion and located on a first portion of a substrate, and a pre-pad structure comprising, from bottom to top, a silicon material portion, a silicon germanium alloy material portion having the first germanium content, and a hard mask material portion and located on a second portion of the substrate. Next, a condensation oxidation is performed to convert the silicon material fin portion and the silicon germanium alloy fin portion into a silicon germanium alloy fin having a second germanium content and a second width, wherein the second germanium content is greater than the first germanium content and wherein the second width is less than the first width, while simultaneously converting the silicon material portion and the silicon germanium alloy material portion having the first germanium content into a laterally graded silicon germanium alloy material portion. After the condensation oxidation, sidewall surfaces and a topmost surface of both the silicon germanium alloy fin and the laterally graded silicon germanium alloy material portion are exposed.

In another aspect of the present application, a semiconductor structure is provided. In one embodiment of the present application, the semiconductor structure includes a silicon germanium alloy fin having a second germanium content located on a first portion of a substrate. The structure further includes a laterally graded silicon germanium alloy material portion located on a second portion of the substrate, wherein the laterally graded silicon germanium alloy material portion is spaced apart from the silicon germanium alloy fin and has end portions having the second germanium content and a middle portion located between the end portions that has a first germanium content that is less than the second germanium content.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
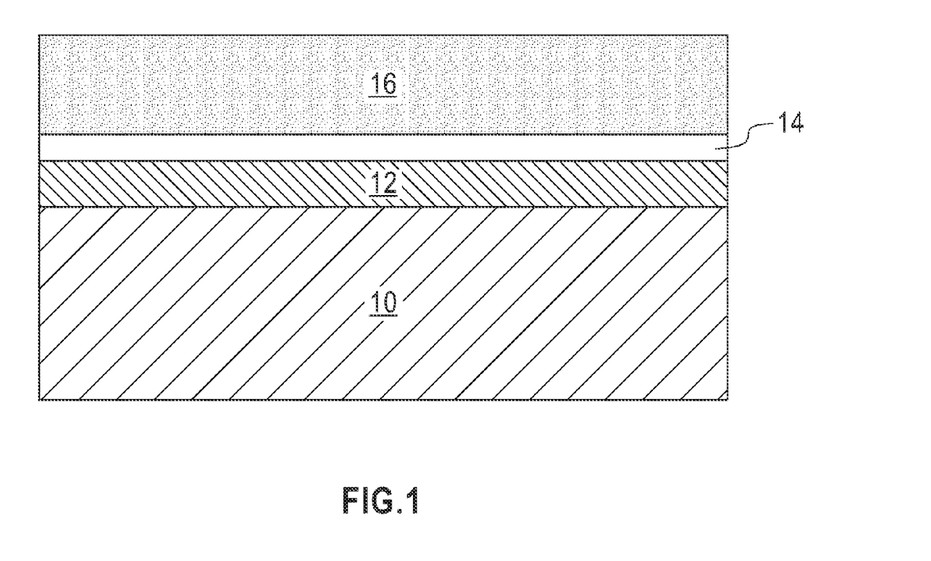
FIG. 1 is a cross sectional view of an exemplary semiconductor structure including a silicon germanium alloy layer having a first germanium content that is located on surface of a silicon material layer that can be employed in accordance with an embodiment of the present application.

Referring first to FIG. 1, there is illustrated an exemplary semiconductor structure including a silicon germanium alloy layer 16 having a first germanium content that is located on surface of a silicon material layer 14 that can be employed in accordance with an embodiment of the present application. In one embodiment of the present application and as illustrated in FIG. 1, the silicon material layer 14 is located on a surface of an insulator layer 12 and the insulator layer 12 is located on a surface of handle substrate 10. Collectively, the silicon material layer 14, the insulator layer 12 and the handle substrate 10 provide a silicon-on-insulator (SOI) substrate. In some embodiments (not shown), the handle substrate 10 can be omitted.

In yet other embodiments, elements 10 and 12 collectively form a lower portion of a bulk semiconductor substrate, while silicon material layer 14 represents an upper portion of the bulk semiconductor substrate. By "bulk" it is meant that the entirety of the substrate is comprised of at least one semiconductor material. In one embodiment, the lower portion of the bulk semiconductor substrate is also comprised of silicon; in such an embodiment, the entirety of the bulk semiconductor material is comprised of silicon. In another embodiment, the lower portion of the bulk semiconductor substrate comprises at least one other semiconductor material besides silicon including, for example, Ge, SiGe, SiC, SiGeC, and III/V compound semiconductors such as, for example, InAs, GaAs, or InP.

In embodiments in which an SOI substrate is employed, the handle substrate 10 provides mechanical support for the insulator layer 12 and the silicon material layer 14. The handle substrate 10 may comprise a semiconductor material including, for example, Si, Ge, SiGe, SiC, SiGeC, and III/V compound semiconductors such as, for example, InAs, GaAs, or InP. In some embodiments, the handle substrate 10 is a non-semiconductor material including, for example, a dielectric material and/or a conductive material.

The insulator layer 12 of the SOI substrate may be a crystalline or non-crystalline oxide or nitride. In one embodiment, the insulator layer 12 is an oxide such as, for example, silicon dioxide. In another embodiment, the insulator layer 12 is a nitride such as, for example silicon nitride or boron nitride. In yet other embodiments, insulator layer 12 is a multilayered stack of, in any order, silicon dioxide and boron nitride.

The SOI substrate may be formed utilizing standard processes including for example, SIMOX (separation by ion implantation of oxygen) or layer transfer in which two wafers are bonded together. The thickness of the silicon material layer 14 can be from 10 nm to 100 nm. Other thicknesses that are lesser than, or greater than, the aforementioned thickness range may also be employed as the thickness of the silicon material layer 14. The insulator layer 12 can have a thickness from 5 nm to 200 nm. Other thicknesses that are lesser than, or greater than, the aforementioned thickness range may also be employed as the thickness of the insulator layer 12. The thickness of the handle substrate 10 is inconsequential to the present application.

The silicon material layer 14 that can be employed in the present application is typically a single crystalline silicon material. The silicon material layer 14 is typically non-doped at this point of the present application. The crystal orientation of the silicon material layer 14 may be {100}, {110}, or {111}. Other crystallographic orientations besides those specifically mentioned can also be used in the present application.

The exemplary semiconductor structure of FIG. 1 also includes silicon germanium alloy layer 16 having a first germanium content located on an entirety of a surface of the silicon material layer 14. In accordance with the present application, the first germanium content of the silicon germanium alloy layer 16 is low so as to allow formation of a defect-free silicon germanium alloy layer 16 that has a thickness, i.e., height, which is above its critical thickness. In one embodiment of the present application, the first germanium content of the silicon germanium alloy layer 16 is from 10 atomic percent germanium to 25 atomic percent germanium. In one embodiment of the present application, the first silicon germanium alloy layer 16 that is provided has a thickness, i.e., height, from 30 nm to 100 nm.

In some embodiments, the silicon germanium alloy layer 16 can be formed on the silicon material layer 14 utilizing any well known epitaxial growth or epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments of the present application, the silicon germanium alloy layer 16 has an epitaxial relationship, i.e., same crystal orientation, as that of the surface of the silicon material layer 14.

Examples of various epitaxial growth processes that are suitable for use in forming the silicon germanium alloy layer 16 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking. A number of well known silicon germanium alloy source gases may be used for the deposition of the silicon germanium alloy layer 16. Carrier gases like hydrogen, nitrogen, helium and argon can be used.

In yet another embodiment, the exemplary semiconductor structure shown in FIG. 1 can be formed by a wafer bonding process in which a carrier wafer including the silicon germanium alloy layer 16 is bonded to the silicon material layer 14. The carrier wafer is thereafter removed utilizing a well known material removal process including, for example, chemical mechanical polishing and/or grinding.

Figure 2:
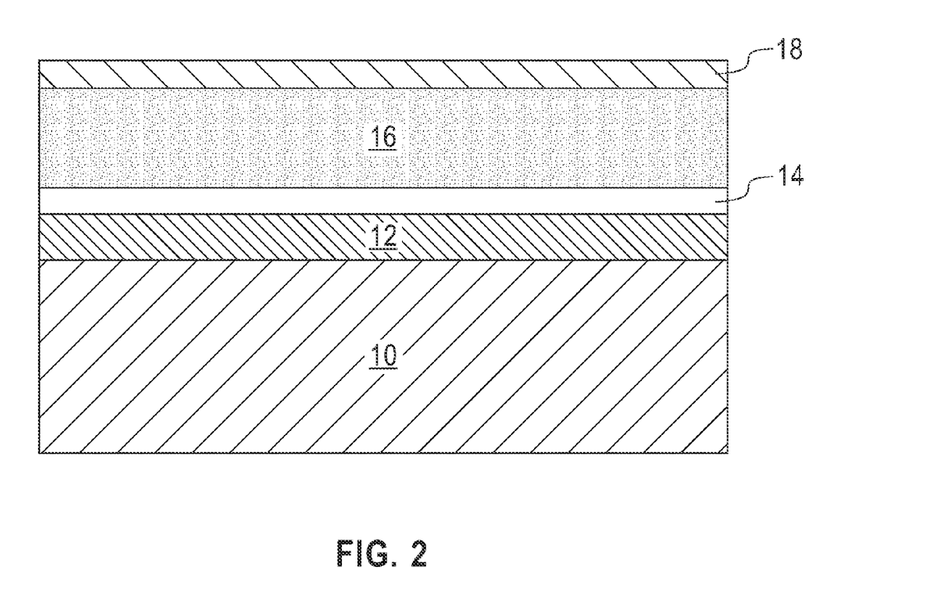
FIG. 2 is a cross sectional view of the exemplary semiconductor structure of FIG. 1 after forming a hard mask material layer on a surface of the silicon germanium alloy layer.

Referring now to FIG. 2, there is illustrated the exemplary semiconductor structure of FIG. 1 after forming a hard mask material layer 18 on a surface of the silicon germanium alloy layer 16. As is shown, the hard mask material layer 18 is a contiguous layer that covers an entirety of the underlying silicon germanium alloy layer 16.

The hard mask material layer 18 that can be employed in the present application may include any hard mask material including, for example, a semiconductor oxide, a semiconductor nitride and/or a semiconductor oxynitride. In one embodiment, the hard mask material that can be used in the present application as the hard mask material layer 18 can be comprised of silicon dioxide. In another embodiment, the hard mask material that can be used in the present application as the hard mask material layer 18 can be comprised of silicon nitride. In yet another embodiment, the hard mask material that can be used in the present application as the hard mask material layer 18 can include a hard mask stack of, in any order, silicon dioxide and silicon nitride.

In some embodiments, the hard mask material that can provide the hard mask material layer 18 can be formed by a deposition process such as, for example, chemical vapor deposition (CVD) or plasma enhanced chemical vapor deposition (PECVD). In other embodiments, the hard mask material that can provide the hard mask material layer 18 can be formed by a thermal process such as, for example, thermal oxidation and/or thermal nitridation. In yet other embodiments, the hard mask material that can provide the hard mask material layer 18 can be formed by a combination of a deposition process and a thermal process. The thickness of the hard mask material that can be used in the present application as the hard mask material layer 18 can range from 2 nm to 10 nm. Other thicknesses than are lesser than, or greater than, the aforementioned thickness range can also be used as the thickness of the hard mask material.

Figure 3:
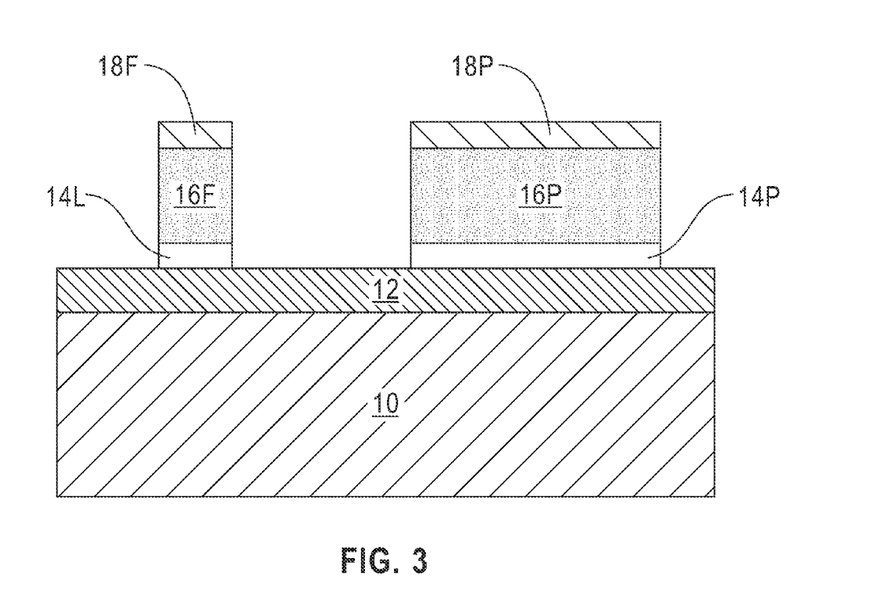
FIG. 3 is a cross sectional view of the exemplary semiconductor structure of FIG. 2 after patterning the hard mask layer, the silicon germanium alloy layer and the silicon material layer to provide a fin structure comprising, from bottom to top, a silicon material fin portion, a silicon germanium alloy fin portion having the first germanium content and a first width, and a hard mask material fin portion on a first portion of a substrate, and a pre-pad structure comprising, from bottom to top, a silicon material portion, a silicon germanium alloy material portion having the first germanium content, and a hard mask material portion on a second portion of the substrate.

Referring now to FIG. 3, there is illustrated the exemplary semiconductor structure of FIG. 2 after patterning the hard mask material layer 18, the silicon germanium alloy layer 16 and the silicon material layer 14 to provide a fin structure (14F, 16F, 18F) on a first portion of the substrate (i.e., either insulator layer 12 or a remaining portion of a bulk silicon substrate) and a pre-pad structure (14P, 16P, 18P) on second portion of the substrate (i.e., either insulator layer 12 or a remaining portion of a bulk silicon substrate).

The patterning that provides the fin structure (14F, 16F, 18F) represents a fin patterning process, while the patterning that provides the pre-pad structure (14P, 16P, 18P) represents a pad patterning process. The fin patterning process that provides the fin structure (14F, 16F, 18F) can be performed prior to, or after, the pad patterning process that provides the pre-pad structure (14P, 16P, 18P). Thus, the fin patterning process and the pad patterning process are discrete patterning processes. Block mask technology may be used to protect one of the structures (i.e., fin structure or pre-pad structure) during the patterning of the other structure.

The fin structure (14F, 16F, 18F) is present in a device region of the exemplary semiconductor structure, while the pre-pad structure (14P, 16P, 18P) is present in a pad region of the exemplary semiconductor structure; the pad region lies to the periphery of the device region. While a single fin structure (14F, 16F, 18F) and a single pre-pad structure (14P, 16P, 18P) are described and illustrated, a plurality of fin structures (14F, 16F, 18F) and/or a plurality of pre-pad structures (14P, 16P, 18P) can be formed in the present application.

The fin structure (14F, 16F, 18F) that is provided by the fin patterning process comprises, from bottom to top, a silicon material fin portion 14F, a silicon germanium alloy fin portion 16F having the first germanium content and a first width, and a hard mask material fin portion 18F. The silicon material fin portion 14F constitutes a portion of the silicon material layer 14 that remains after the fin patterning process, the silicon germanium alloy fin portion 16F constitutes a portion of the silicon germanium alloy layer 16 that remains after the fin patterning process, while the hard mask material fin portion 18F constitutes a portion of the hard mask material layer 18 that remains after the fin patterning process.

The pre-pad structure (14P, 16P, 18P) that is provided by the pad patterning process comprises, from bottom to top, a silicon material portion 14P, a silicon germanium alloy material portion 16P having the first germanium content, and a hard mask material portion 18P. The silicon material portion 14P constitutes a portion of the silicon material layer 14 that remains after the pad patterning process, the silicon germanium alloy material portion 16P constitutes a portion of the silicon germanium alloy layer 16 that remains after the pad patterning process, while the hard mask material portion 18P constitutes a portion of the hard mask material layer 18 that remains after the pad patterning process. The fins structure (14F, 16F, 18F) has the first width mentioned above and the various elements that provide the fin structure (14F, 16F, 18F) have sidewall surfaces that are vertically coincident with each other.

The fin structure (14F, 16F, 18F) that is formed includes a pair of vertical sidewalls that are parallel to each other. As used herein, a surface is "vertical" if there exists a vertical plane from which the surface does not deviate by more than three times the root mean square roughness of the surface. The fin structure (14F, 16F, 18F) has a width (i.e., the first width) from 12 nm to 40 nm and a length from 100 nm to 2000 nm. The width of the fin structure (14F, 16F, 18F) is greater than a width of a final silicon germanium alloy fin that is to be subsequently formed from the semiconductor components of the fin structure (14F, 16F, 18F). Other widths and lengths are possible and can be used in the present application for the fin structure (14F, 16F, 18F).

The pre-pad structure (14P, 16P, 18P) that is formed includes a pair of vertical sidewalls that are parallel to each other. The pre-pad structure (14P, 16P, 18P) has a width that is greater than a width of the fin structure (14F, 16F, 18F). In one embodiment, the width of the pre-pad structure (14P, 16P, 18P) can be from 100 nm to 500 micrometers. The length of the pre-pad structure (14P, 16P, 18P) may vary. A typical length of the pre-pad structure (14P, 16P, 18P) can be from 100 nm to 500 micrometers. Other widths and lengths are possible and can be used in the present application for the pre-pad structure (14P, 16P, 18P).

The height of the fin structure (14F, 16F, 18F) and the height of the pre-pad structure (14P, 16P, 18P) are the same. As such, a topmost surface of the fin structure (14F, 16F, 18F) is coplanar with a topmost surface of the pre-pad structure (14P, 16P, 18P).

In one embodiment, the fin and/or pad patterning process may include lithography and etching. Lithography includes forming a photoresist material (not shown) on an exposed surface of the hard mask material layer 18. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion the hard mask material layer 18. The pattern provided by the patterned photoresist material is thereafter transferred into the underlying material layers utilizing at least one pattern transfer etching process; the etch stops either on a surface of the insulator layer 12 or within a bottom portion of a bulk semiconductor substrate. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment of the present application, a sidewall image transfer (SIT) process can be used as the fin and/or pad patterning process. Although a SIT process can be used in forming the pre-pad structure (14P, 16P, 18P), the SIT process is typically used to provide the fin structure (14F, 16F, 18F). The SIT process includes forming a contiguous mandrel material layer (not shown) over the hard mask material layer 18. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying layers stopping atop the insulator layer 12 or within a bottom portion of a bulk semiconductor substrate. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Figure 4:
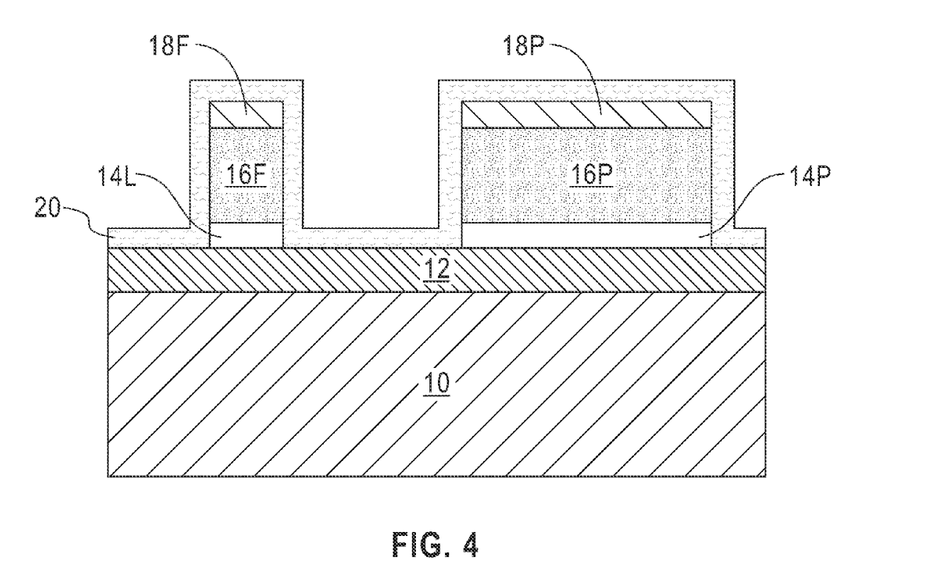
FIG. 4 is a cross sectional view of the exemplary semiconductor structure of FIG. 3 after forming an optional oxide liner on exposed surfaces of the fin structure and the pre-pad structure in accordance with an embodiment of the present application.

Referring now to FIG. 4, there is illustrated the exemplary semiconductor structure of FIG. 3 after forming an oxide liner 20 on exposed surfaces of the fin structure (14F, 16F, 18F) and the pre-pad structure (14P, 16P, 18P) in accordance with an embodiment of the present application. In some embodiments, the oxide layer 20 can be omitted. In some embodiments, and as shown, the oxide liner 20 is a contiguous layer that is formed across the entirety of the exemplary semiconductor structure shown in FIG. 3. Thus, the oxide liner 20 is present on exposed portions of the insulator layer 12 (or a bottom portion of the bulk semiconductor substrate that remains after defining the fin structure (14F, 16F, 18F) and the pre-pad structure (14P, 16P, 18P)), and sidewall surfaces and a topmost surface of fin structure (14F, 16F, 18F) and the pre-pad structure (14P, 16P, 18P).

The oxide liner 20 can be formed by a deposition process including, but not limited to, chemical vapor deposition or plasma enhanced chemical vapor deposition. The oxide liner 20 is a conformal layer that has a thickness from 2 nm to 10 nm. Other thickness that are lesser than, or greater than, the aforementioned thickness range may also be used for the thickness of oxide liner 20. The oxide liner 20 may comprise silicon dioxide or any other dielectric oxide material.

Figure 5:
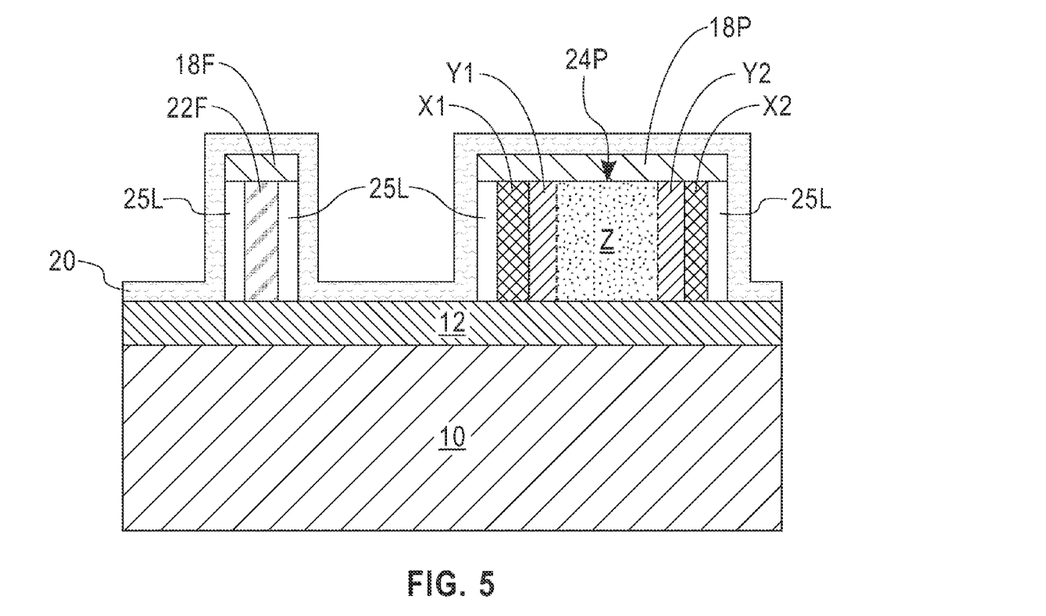
FIG. 5 is a cross sectional view of the exemplary semiconductor structure of FIG. 4 after performing a condensation oxidation which converts the silicon material fin portion and the silicon germanium alloy fin portion into a silicon germanium alloy fin having a second germanium content and a second width, wherein the second germanium content is greater than the first germanium content and wherein the second width is less than the first width, and which simultaneously converts the silicon material portion and the silicon germanium alloy material portion into a laterally graded silicon germanium alloy material portion.

Referring now to FIG. 5, there is shown the exemplary semiconductor structure of FIG. 4 after performing a condensation oxidation. The condensation oxidation converts the silicon material fin portion 14F and the silicon germanium alloy fin portion 16F into a silicon germanium alloy fin 22F having a second germanium content and a second width. In accordance with the present application, the second germanium content of the silicon germanium alloy fin 22F is greater than the first germanium content of the silicon germanium alloy fin portion 16F and the second width is less than the first width. In one embodiment, the second germanium content of the silicon germanium alloy fin 22F is from 20 atomic percent germanium to 60 atomic percent germanium. In one embodiment, the second width of the silicon germanium alloy fin 22F that is formed by the condensation oxidation is from 6 nm to 15 nm. The height of the silicon germanium alloy fin 22F is equal to the thickness of silicon material fin portion 14F and the silicon germanium alloy fin portion 16F. In one embodiment, the height of the silicon germanium alloy fin 22F is from 20 nm to 100 nm.

Also, the condensation oxidation simultaneously converts the silicon material portion 14P and the silicon germanium alloy material portion 16P into a laterally graded silicon germanium alloy material portion 24P. The laterally graded silicon germanium alloy material portion 24P is spaced apart from the silicon germanium alloy fin 22 and forms a pad structure of the present application. The laterally graded silicon germanium alloy material portion 24P has end portions (X1, X2) having the second germanium content and a middle portion (Z) located between the end portions (X1, X2) that has a first germanium content that is less than the second germanium content. The laterally graded silicon germanium alloy material portion 24P may also have further portions (Y1, Y2) having a laterally decreasing germanium content located between the end portions (X1, X2) and the middle portion (Z). The germanium content in the further portions (Y1, Y2) decreases in a lateral direction from the interface with the end portions (X1, X2) to the interface with the middle portion (Z).

During condensation oxidation, Si atoms within the silicon germanium alloy fin portion 16F and the silicon material fin portion 14F react with oxygen forming a silicon oxide layer 25L and Ge atoms from the silicon germanium alloy fin portion 16F diffuse inwards into a middle portion of the silicon germanium alloy fin portion 16F concentrating germanium therein and providing an upper portion of the silicon germanium alloy fin 22F. Ge atoms also diffuse downwards from the silicon germanium alloy fin portion 16F and into the silicon material fin portion 14F whereat the germanium atoms react with Si to form a lower portion of the silicon germanium alloy fin 22F. Similar diffusion is also occurring with the pre-pad structure (14P, 16P, 18P) so as to provide the laterally graded silicon germanium alloy material portion 24P mentioned above. The remaining hard mask material (18F, 18P) and, if present, the oxide liner 20 serves as a Ge diffusion cap.

The condensation oxidation can be performed by an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constitutes from 2 volume % to 95 volume % of an oxidizing ambient containing admixture. The condensation oxidation can be performed at a temperature from 400° C. to 1300° C. The condensation oxidation may include a furnace anneal, a rapid thermal anneal or any other anneal that can provide the exemplary semiconductor structure shown in FIG. 5. By using the above described condensation oxidation, the silicon germanium alloy fin 22F that is formed has a second width that is less than the first width of the silicon germanium alloy fin portion 16F of the fin structure (14F, 16F, 18F), a second germanium content that is greater than the first germanium content of the silicon germanium alloy fin portion 16F, and a height that is greater than the height of the silicon germanium alloy fin portion 16F. Thus, the condensation oxidation provides a silicon germanium alloy fin 22F that is defect-free and has a height that greater than a height of the critical thickness of the originally silicon germanium alloy layer 14 mentioned above.

Figure 6:
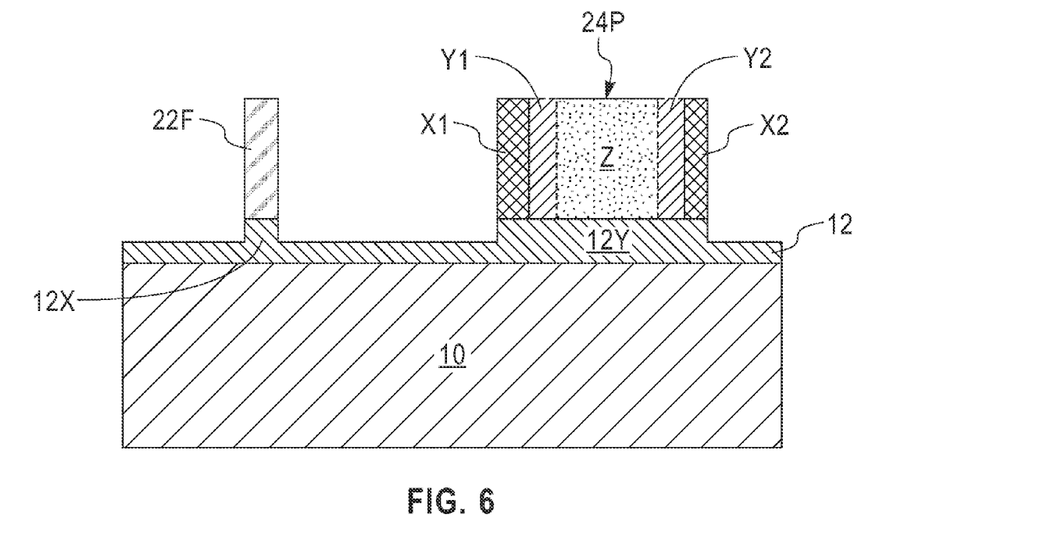
FIG. 6 is a cross sectional view of the semiconductor structure of FIG. 5 after exposing sidewall surfaces and a topmost surface of both the silicon germanium alloy fin and the laterally graded silicon germanium alloy material portion.

Referring now to FIG. 6, there is illustrated the semiconductor structure of FIG. 5 after exposing sidewall surfaces and a topmost surface of both the silicon germanium alloy fin 22F and the laterally graded silicon germanium alloy material portion 24P. The exposing the sidewall surfaces and a topmost surface of both the silicon germanium alloy fin 22F and the laterally graded silicon germanium alloy material portion 24P includes removing oxide formed during the condensation oxidation (i.e., silicon oxide layer 25L), the optional oxide liner 20, the hard mask material fin portion 18F and the hard mask material portion 18P.

In one embodiment, the removal of oxide material (i.e., oxide liner 20 and silicon oxide layer 25L) may be performed utilizing an etching process that is selective in removing a dielectric material oxide. In one embodiment, the oxide material may be removed utilizing a buffered oxide etchant such as, for example, buffered HF. In some embodiments and when the hard mask material is an oxide, the remaining hard mask materials (the hard mask material fin portion 18F and the hard mask material portion 18P) can also be removed utilizing the buffered oxide etchant. In other embodiments and when the hard mask material is other than an oxide, the remaining hard mask materials (the hard mask material fin portion 18F and the hard mask material portion 18P) can be removed utilizing another etch or by performing a planarization process such as, for example, chemical mechanical polishing.

In some embodiments of the present application, a portion of the insulator layer 12 can be removed during this step providing a first insulator pedestal portion 12X that is in direct contact with a bottommost surface of the silicon germanium alloy fin 22F and a second insulator pedestal portion 12Y that is in direct contact with a bottommost surface of the laterally graded silicon germanium alloy material portion 24P. In embodiments in which a bulk semiconductor substrate was used, this step may also remove a remaining portion of the bulk semiconductor substrate and provide a first semiconductor material pedestal portions that is in direct contact with a bottommost surface of the silicon germanium alloy fin 22F and a second semiconductor pedestal portion that is in direct contact with a bottommost surface of the laterally graded silicon germanium alloy material portion 24P.

After exposing sidewall surfaces and a topmost surface of both the silicon germanium alloy fin 22F and the laterally graded silicon germanium alloy material portion 24P, a topmost surface of the silicon germanium alloy fin 22F is coplanar with a topmost surface of the laterally graded silicon germanium alloy material portion 24P. As is shown, the width of the silicon germanium alloy fin 22F is less than a width of the laterally graded silicon germanium alloy material portion 24P.

Figure 7:
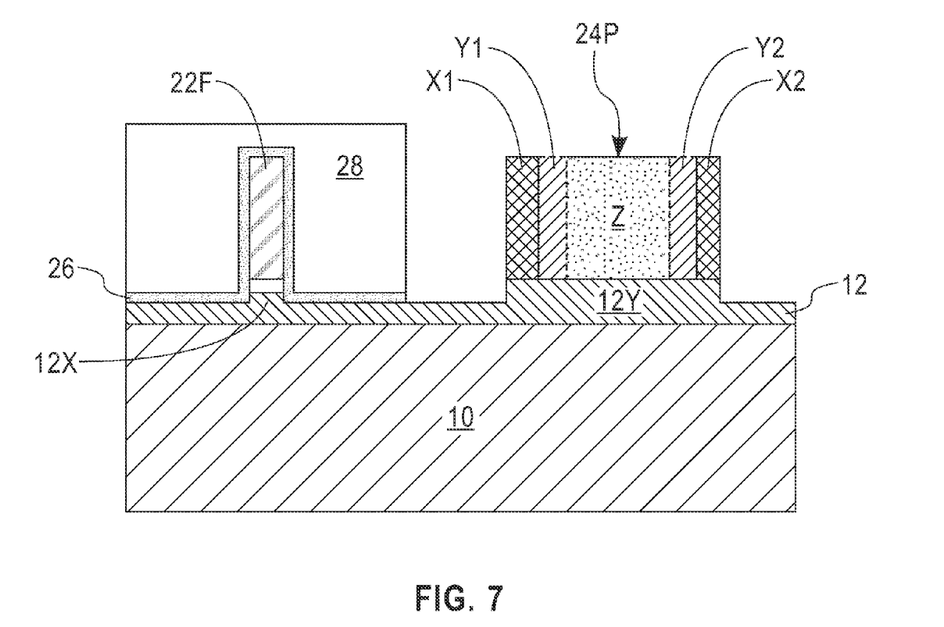
FIG. 7 is a cross sectional view of the semiconductor structure of FIG. 6 after forming a gate structure straddling the silicon germanium alloy fin.

Referring now to FIG. 7, there is illustrated the semiconductor structure of FIG. 6 after forming a gate structure straddling the silicon germanium alloy fin 22F. By "straddling" it is meant that at least one portion of the gate structure is located on one side of the silicon germanium alloy fin 22F, while another portion of the same gate structure is located on another side of the silicon germanium alloy fin 22F. The two portions are interconnected by a portion of the gate structure that is located directly atop the silicon germanium alloy fin 22F. As shown in the illustrated embodiment, a portion of the gate structure contacts a topmost surface of insulator layer 12. Although a single gate structure is described and illustrated, a plurality gate structures can be formed straddling different portions of the silicon germanium alloy fin 22F.

In one embodiment (and as shown), the gate structure is a functional gate structure. By "functional gate structure" it is meant a permanent gate structure used to control output current (i.e., flow of carriers in the channel) of a semiconducting device through electrical or magnetic fields. The functional gate structure includes a gate material stack of, from bottom to top, a gate dielectric portion 26 and a gate conductor portion 28. In some embodiments, a gate cap portion not shown) can be present atop the gate conductor portion 28.

The gate dielectric portion 26 of the functional gate structure comprises a gate dielectric material. The gate dielectric material that provides the gate dielectric portion 26 can be an oxide, nitride, and/or oxynitride. In one example, the gate dielectric material that provides the gate dielectric portion 26 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 26. In some embodiments and when multiple functional gate structures are formed, each gate dielectric portion comprises a same gate dielectric material. In other embodiments and when multiple functional gate structures are formed, the gate dielectric portion for a first set of the functional gate structures comprises a different gate dielectric material than the gate dielectric portion for a second set of the functional gate structures.

The gate dielectric material used in providing the gate dielectric portion 26 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions, block mask technology can be used. In one embodiment of the present application, the gate dielectric material used in providing the gate dielectric portion 26 can have a thickness in a range from 1 nm to 10 nm. Other thicknesses that are lesser than, or greater than, the aforementioned thickness range can also be employed for the gate dielectric material.

The gate conductor portion 28 of the functional gate structure comprises a gate conductor material. The gate conductor material used in providing the gate conductor portion 28 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments and when multiple functional gate structures are formed, the gate conductor portion of each functional gate structure is a same conductive material. In other embodiments and when multiple functional gate structures are formed, the gate conductor portion of a first set of functional gate structures comprises a different gate conductor material than the gate conductor portion of a second set of functional gate structure. For example, the gate conductor portion of a first set of functional gate structures may comprise an nFET gate metal, while the gate conductor portion of a second set of functional gate structures may comprise a pFET gate metal.

The gate conductor material used in providing the gate conductor portion 28 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portion of different functional gate structures, block mask technology can be used. In one embodiment, the gate conductor material used in providing the gate conductor portion 28 has a thickness from 1 nm to 100 nm. Other thicknesses that are lesser than, or greater than, the aforementioned thickness range can also be employed for the gate conductor material used in providing the gate conductor portion 28.

If present, the gate cap portion of the functional gate structure comprises a gate cap material. The gate cap material that provides the gate cap portion may include one of the hard mask materials mentioned above. In one embodiment, each gate cap portion comprises silicon dioxide, silicon nitride, and/or silicon oxynitride. The material that provides the gate cap portion can be formed utilizing a conventional deposition process such as, for example, chemical vapor deposition or plasma enhanced chemical vapor deposition. The material that provides the gate cap portion can has a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), dielectric spacers (not shown) can be formed on exposed sidewall surfaces of the respective gate structure. The dielectric spacers may comprise one of the dielectric materials mentioned above for dielectric spacers used in the SIT process. The dielectric spacers can be formed by depositing a spacer material and thereafter a spacer etch can be performed.

Next, a source region (not shown) is formed on one side of the gate structure and within an exposed first portion of the silicon germanium alloy fin 22F, and a drain region (not shown) is formed on another side of the gate structure and within an exposed second portion of the silicon germanium alloy fin 22F. The source region and the drain region would run into an out of the plane of the paper including the exemplary semiconductor structure shown in FIG. 7.

In one embodiment, the source region and the drain region can be formed by introducing an n-type dopant or a p-type dopant into portions of the silicon germanium alloy fin 22F not covered by the gate structure, and the dielectric spacer. The term "p-type" refers to the addition of impurities to an intrinsic semiconductor that creates deficiencies of valence electrons. "N-type" refers to the addition of impurities that contributes free electrons to an intrinsic semiconductor. The doping may be achieved utilizing ion implantation or gas phase doping. In embodiments in which a sacrificial gate structure was employed, the sacrificial gate structure can now be replaced with a functional gate structure.

In some embodiments, an epitaxial semiconductor material that is doped can be formed on the exposed portions of silicon germanium alloy fin 22F and can be used as the source/drain regions of the respective gate structure. The epitaxial semiconductor material between the source regions and drain regions within a given device region can be merged or unmerged. The epitaxial semiconductor material can be formed utilizing an epitaxial growth process. In one embodiment, n-type or p-type dopants are present during the epitaxial growth of the semiconductor material. In another embodiment, n-type or p-type dopants can be introduced into an intrinsic after epitaxial growth of an epitaxial semiconductor material by ion implantation or gas phase doping. In embodiments in which a sacrificial gate structure was employed, the sacrificial gate structure can now be replaced with a functional gate structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing a fin structure comprising, from bottom to top, a silicon material fin portion, a silicon germanium alloy fin portion having a first germanium content and a first width, and a hard mask material fin portion and located on a first portion of a substrate, and a pre-pad structure having a width that is greater than said first width and comprising, from bottom to top, a silicon material portion, a silicon germanium alloy material portion having said first germanium content, and a hard mask material portion and located on a second portion of said substrate, wherein said fin structure and said pre-pad structure are entirely spaced apart from each other by a gap;
   performing a condensation oxidation to convert both of said silicon material fin portion and said silicon germanium alloy fin portion into a silicon germanium alloy fin having a second germanium content and a second width, wherein said second germanium content is greater than said first germanium content and wherein said second width is less than said first width, while simultaneously converting said silicon material portion and said silicon germanium alloy material portion having said first germanium content into a laterally graded silicon germanium alloy material portion; and
   removing oxide formed during said condensation oxidation, said hard mask material fin portion from atop said silicon germanium alloy fin and said hard mask material portion from atop said laterally graded silicon germanium alloy material portion, wherein said removing oxide further removes a portion of an underlying substrate, wherein a pedestal portion of said substrate remains directly beneath each of said silicon germanium alloy fin and said laterally graded silicon germanium alloy material portion.

2. The method of claim 1, wherein prior to said performing said condensation oxidation, an oxide liner is formed on exposed surfaces of said fin structure and exposed surfaces of said pre-pad structure.

3. The method of claim 1, wherein said providing said fin structure and said pre-pad structure comprises:
   forming a silicon germanium alloy layer having said first germanium content on a surface of a silicon material layer;
   forming a hard mask material layer on said silicon germanium alloy layer; and
   patterning said hard mask layer, said silicon germanium alloy layer and silicon material layer to provide said fin structure and said pre-pad structure.

4. The method of claim 3, wherein said silicon material layer is an upper portion of a bulk semiconductor substrate or a topmost surface of a silicon-on-insulator substrate.

5. The method of claim 3, wherein said forming said silicon germanium alloy layer comprises an epitaxial growth process.

6. The method of claim 1, wherein said removing said oxide comprises an etching process, and said removing said hard mask material fin portion and said hard mask material portion comprises etching or a planarization process.

7. The method of claim 1, wherein said condensation oxidation is performed in an oxygen-containing ambient and at a temperature from 400° C. to 1300° C.

8. The method of claim 1, further comprising forming a functional gate structure straddling over a portion of said silicon germanium alloy fin.

9. The method of claim 1, wherein said first germanium content is from 10 atomic percent to 25 atomic percent and said second germanium content is from 20 atomic percent to 60 atomic percent.

10. The method of claim 1, wherein after said removing said oxide, said hard mask material fin portion and said hard mask material portion said topmost surface of said silicon germanium alloy fin is coplanar with said topmost surface of said laterally graded silicon germanium alloy material portion.

11. The method of claim 1, wherein said laterally graded silicon germanium alloy material portion has end portions having said second germanium content and a middle portion located between said end portions that has said first germanium content.

* * * * *